United States Patent [19]

Doyen

[11] Patent Number: 4,516,096
[45] Date of Patent: May 7, 1985

[54] MAGNETIC CIRCUIT FOR AN YTTRIUM-IRON GARNET CRYSTAL RESONATOR FOR AN OSCILLATOR

[75] Inventor: Daniel Doyen, Ozoir, France

[73] Assignee: U.S. Philips Corporation, New York, N.Y.

[21] Appl. No.: 547,146

[22] Filed: Oct. 31, 1983

[30] Foreign Application Priority Data

Nov. 22, 1982 [FR] France ............................... 82 19525

[51] Int. Cl.³ .............................................. H01P 7/00
[52] U.S. Cl. .................................... 333/219; 335/297; 331/96
[58] Field of Search ............... 333/202, 219, 227, 231, 333/235; 335/209, 219, 296, 297, 298; 331/107 DP, 117 D, 96

[56] References Cited

U.S. PATENT DOCUMENTS 3,576,503  4/1971  Hanson ..................... 331/107 DP X
4,468,643  8/1984  Barger ................................ 333/202

Primary Examiner—Paul Gensler
Attorney, Agent, or Firm—Robert J. Kraus

[57] ABSTRACT

Magnetic circuit for an yttrium-iron garnet crystal (11) resonator for an oscillator, formed by a first cylindrical pole piece (12) comprising a coil (13) provided around an axial core (14) and a second cylindrical pole piece (15) having a flat bottom (16), the yttrium-iron garnet crystal (11) being placed in a gap (17) defined by an end (18) of the axial core (14) and the part (19) of the flat bottom facing the end (18). According to the invention, a circular groove (20) is arranged in the flat bottom (16) around the part (19) facing the end (18) of the axial core (14).

2 Claims, 1 Drawing Figure

MAGNETIC CIRCUIT FOR AN YTTRIUM-IRON GARNET CRYSTAL RESONATOR FOR AN OSCILLATOR

BACKGROUND OF THE INVENTION

The present invention relates to a magnetic circuit for an yttrium-iron garnet crystal resonator for an oscillator, formed by a first cylindrical pole piece comprising a coil provided around an axial core, and a second cylindrical pole piece having a flat bottom, the two cylindrical pole pieces being joined together so as to close the magnetic circuit and the yttrium-iron garnet crystal being positioned in a gap defined by an end of the axial core and that part of the flat bottom facing the end.

The invention is used with great advantage in the field of high-frequency oscillators having as a resonator an yttrium-iron garnet crystal, also known as YIG oscillator.

The magnetic circuits of the type described in the opening paragraph have the advantage that they can be readily produced in so far as the second pole piece has a flat bottom, which also enables easy positioning of the high-frequency circuit coupled to the YIG crystal, by fixing it on the flat bottom. However, these known magnetic circuits have the disadvantage that they have rather significant stray fields, as a result of which, at high frequencies, for example frequencies above 10 GHz, the frequency-current relationship in the coil is no longer linear since, because of the stray fields and saturation of the materials, it is necessary to pass through the coil a current which is larger than necessary. It is an object of the invention to obviate this disadvantage while maintaining the main advantages of the flat bottom.

SUMMARY OF THE INVENTION

According to the invention, a magnetic circuit for an yttrium-iron garnet crystal resonator for an oscillator, formed by a first cylindrical pole piece comprising a coil provided around an axial core, and a second cylindrical pole piece having a flat bottom, the two cylindrical pole pieces being joined together so as to close the magnetic circuit and the yttrium-iron garnet crystal being located in a gap defined by an end of the axial core and that part of the flat bottom facing the end, is characterized in that a circular groove is provided in the flat bottom around the part facing the end of the axial core.

Thus, the groove applied in the flat bottom at the periphery of the gap renders it possible to reduce to a very significant extent the stray fields of the circuit, which, in the event of a strong field, results in an improvement of the current-frequency linearity and in an improved sensitivity of the arrangement. One may then consider the use of a coil of smaller dimensions as well as a reduced magnetic circuit, which results in a gain in volume and weight. In addition, it should be noted that a decrease in the quantity of materials used results in a reduction in the magnetic retentivity and, consequently, in a shorter switching period.

In a preferred embodiment of the invention, the width of the groove is between 1 and 2 times the width of the gap and the depth of the groove is on the order of the width of the gap. These dimensional characteristics result in a small-sized groove which preserves the advantages of a flat bottom for the second pole piece, namely ease of manufacture and the possibility to apply the high frequency circuit in intimate contact with the flat bottom, with the additional advantage of a good heat discharge.

BRIEF DESCRIPTION OF THE DRAWING

The following description given by way of non-limitative example with reference to the accompanying drawing, will give a better understanding of the invention and how it can be put into effect.

DESCRIPTION OF THE PREFERRED EMBODIMENT

Figure 1:
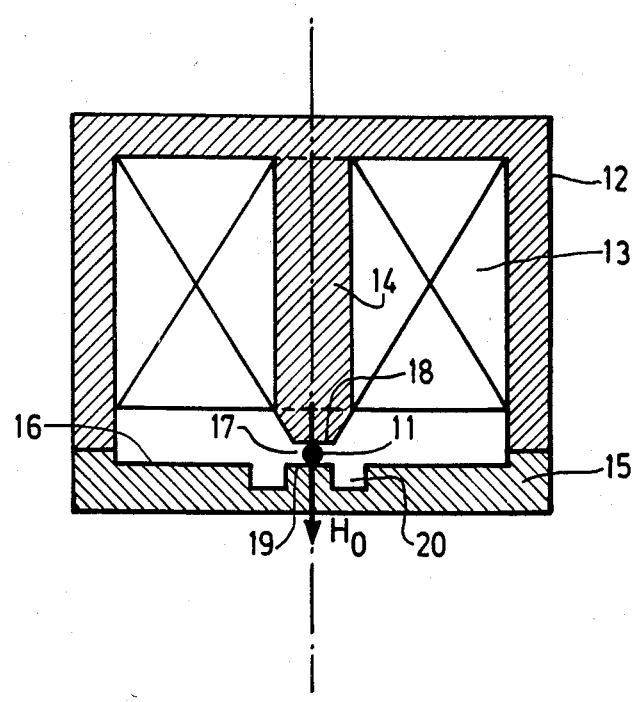
FIG. 1 is a cross-sectional view through a resonator for a high-frequency oscillator according to the invention.

The magnetic circuit for a resonator in the form of an yttrium-iron garnet crystal for use in an oscillator, shown in FIG. 1, is formed by a first cylindrical pole piece 12 comprising a coil 13 provided around an axial core 14 and by a second cylindrical pole piece 15 having a flat bottom 16. The two cylindrical pole pieces 12, 15 are joined together so as to close the magnetic circuit, and the resonator in the form of a YIG ball 11 is placed in a gap 17 defined by an end 18 of the axial core 14 and the part 19 of the flat bottom 16 facing the end 18. As can be seen from FIG. 1, a groove 20 is provided in the flat bottom 16 around the part 19 facing the end 18 of the axial core 14. This arrangement has for its object, according to the invention, to reduce the stray fields at the periphery of the gap and consequently to increase the current-frequency linearity of the source as well as to improve its sensitivity.

In an advantageous embodiment of the invention, the width of the groove 20 is between 1 and 2 times the width of the gap 17 and the depth of the groove is on the order of the width of the gap. In a particular embodiment applicants produced a magnetic circuit according to the invention in which the gap had a width of 1.8 mm and the groove had a width of 2.75 mm and a depth of 1.5 mm. Applicants have also found a distinct improvement in the linearity of the high-frequency source comprising the magnetic circuit according to the invention. Actually, it was found that the non-linearity, calculated from the difference between the effective frequency and the anticipated frequency for a perfectly linear arrangement, was divided by more than 8 to 18 GHz, passing from 260 MHz to 30 MHz, whereas the saturation zone was moved more than 1 GHz towards the high frequencies.

What is claimed is:

1. A magnetic circuit for an yttrium-iron garnet crystal resonator (11) for an oscillator, formed by a first cylindrical pole piece (12) comprising a coil (13) provided around an axial core (14) and a second cylindrical pole piece (15) having a flat bottom (16), the two cylindrical pole pieces (12,15) being joined together so as to close the magnetic circuit, and the yttrium-iron garnet crystal (11) being placed in a gap (17) defined by an end (18) of the axial core (14) and that part (19) of the flat bottom facing said end (18), characterized in that a circular groove (20) is arranged in the flat bottom (16) around the part (19) facing the end (18) of the axial core (14).

2. A magnetic circuit as claimed in claim 1, characterized in that the width of the groove (20) is between 1 and 2 times the width of the gap (17) and that the depth of the groove is on the order of the width of the gap.

* * * * *